United States Patent [19]

Joo et al.

[11] Patent Number: 5,525,935
[45] Date of Patent: Jun. 11, 1996

[54] HIGH-SPEED BIT SYNCHRONIZER WITH MULTI-STAGE CONTROL STRUCTURE

[75] Inventors: Bheom S. Joo; Bheom C. Lee; Kwon C. Park; Seok Y. Kang, all of Daejeon, Rep. of Korea

[73] Assignees: Electronics and Telecommunications Research Institute; Korea Telecommunications Authority, both of Rep. of Korea

[21] Appl. No.: 423,288

[22] Filed: Apr. 17, 1995

[30] Foreign Application Priority Data

Dec. 2, 1994 [KR] Rep. of Korea ................. 1994-32593

[51] Int. Cl.$^6$ ........................... H03L 7/087; H03L 7/107
[52] U.S. Cl. .................. 331/11; 331/17; 331/23; 331/25; 331/DIG. 2; 327/156; 360/51; 375/375
[58] Field of Search ............................. 331/1 A, 10, 11, 331/15–18, 23, 25, DIG. 2; 360/41, 51; 375/271–284, 322–339, 373, 374, 375, 376; 329/300–310; 327/156–159

[56] References Cited

U.S. PATENT DOCUMENTS

| | | | |
|---|---|---|---|
| 4,400,667 | 8/1983 | Belkin | 331/1 A |
| 4,422,176 | 12/1983 | Summers | 375/120 |
| 4,535,459 | 8/1985 | Hogge, Jr. | 375/80 |
| 4,542,351 | 9/1985 | Okada | 331/11 |
| 4,787,097 | 11/1988 | Rizzo | 331/11 X |
| 4,803,705 | 2/1989 | Gillingham et al. | 375/375 |
| 4,942,370 | 7/1990 | Shigemore | 331/1 A |
| 5,381,116 | 1/1995 | Nuckolls et al. | 331/11 X |
| 5,420,543 | 5/1995 | Lundberg et al. | 331/11 X |

OTHER PUBLICATIONS

"An ECL gate array with integrated PLL—based clock recovery and synthesis of high speed data and telecom applications", by David Rosky, Bruce H. Coy, Marc Friedmann, 182/SPIE vol. 1577 *High–Speed Fiber Networks and Channels* (1991), pp. 182–191.

*Primary Examiner*—David Mis
*Attorney, Agent, or Firm*—Merchant, Gould, Smith, Edell, Welter and Schmidt

[57] ABSTRACT

A high-speed bit synchronizer comprising a phase comparator for detecting a phase relationship between a center of an eye pattern of input NRZ data and a rising transition of a clock pulse from a voltage controlled oscillator (VCO) whenever the input NRZ data makes a transition, a frequency comparator for detecting a frequency relationship between a multiple of a period of the clock pulse from the VCO and a multiple of a period of an external reference clock pulse whenever the external reference clock pulse makes a rising or falling transition, phase and frequency comparator gain limiters for limiting gains of the phase and frequency comparators, respectively, a frequency synchronous signal detector for generating frequency synchronous and asynchronous signals in response to an output of the frequency comparator, a phase difference output controller for controlling the transfer of an output of the phase comparator gain limiter in response to an output of the frequency synchronous signal detector, a low pass filter (integrator) for outputting a voltage of a low frequency component to the VCO in response to an output of the phase difference output controller and an output of the frequency comparator gain limiter, and a frequency-divider for frequency-dividing the clock pulse from the VCO at a desired ratio.

6 Claims, 3 Drawing Sheets

HIGH-SPEED BIT SYNCHRONIZER WITH MULTI-STAGE CONTROL STRUCTURE

BACKGROUND OF THE INVENTION

1. Field of the Invention

The present invention relates in general to a high-speed NRZ data bit synchronizer in which a transition density of NRZ data varies widely, and more particularly to a high-speed bit synchronizer with a multi-stage control structure in which frequency synchronization is performed within a desired frequency range in such a manner that a low pass filter (integrator) cannot output a maximum or minimum value, and phase synchronization is then performed together with the frequency synchronization. The synchronization is performed in such a manner that a voltage controlled oscillator can generate an oscillating frequency synchronously with a multiple of a frequency of an external reference clock pulse, so that the voltage controlled oscillator, such as a semiconductor integrated circuit voltage controlled oscillator, is available even though it has an unstable frequency and, although the number of transitions of rapid input data bits is small, the data and the clock can be stably recovered.

2. Description of the Prior Art

Referring to FIG. 1, there is shown a block diagram of a conventional bit synchronizer. As shown in this drawing, the conventional bit synchronizer comprises a phase comparator 11, a low pass filter (integrator) 12, and a voltage controlled oscillator (referred to hereinafter as VCO) 13.

In the conventional bit synchronizer, as shown in FIG. 1, the phase comparator 11 has an output connected directly to an input of the low pass filter (integrator) 12 (see U.S. Pat. No. 4,400,667, Belkin, U.S. Pat. No. 4,422,176, Summers, and U.S. Pat. No. 4,535,459, Hogge).

Generally, a phase comparator for bit synchronization has an output variable according to the number of transitions of input NRZ data, or a gain variable according to a transition density of the input NRZ data, resulting in a loop gain of a phase locked loop (referred to hereinafter as PLL) circuit being varied according to a bit pattern of the input NRZ data or the probability that the transitions occur in the input NRZ data (see D. L. Duttweiler, "The Jitter Performance of Phase-Locked Loops Extracting Timing from Baseband Data Waveforms", The Bell System Technical Journal, Jan. 1976).

Thus, a higher loop gain of the PLL circuit results in unstable operation of the bit synchronizer when the number of data transitions is large, and a lower loop gain of the PLL circuit results in unstable operation of the bit synchronizer when the number of data transitions is small.

Also in the conventional bit synchronizer, the low pass filter (integrator) 12 of the PLL circuit is operated to detect a magnitude of the low frequency component including a direct current (DC) component from an output pulse from the phase comparator 11, and to output the detected magnitude to the VCO 13. When the output pulse from the phase comparator 11 has the narrow width or a bit rate of the NRZ data is high, the magnitude of the low frequency component cannot be detected therefrom by the low pass filter (integrator) 12 because it is very small, resulting in unstable operation of the PLL circuit (see U.S. Pat. No. 4,400,667, Belkin, U.S. Pat. No. 4,422,176, Summers, and U.S. Pat. No. 4,535,459, Hogge).

To solve the above problem, a recently developed bit synchronizer comprises separately a VCO frequency monitoring PLL circuit and a bit synchronizing PLL circuit for data recovery, for performing separate frequency and phase synchronizations (see U.S. Pat. No. 4,787,097, R. P. Rizzo). Alternatively, a bit synchronizer comprises a PLL circuit including a low pass filter (integrator) for simultaneously controlling a VCO to enhance the performance of the bit synchronization (see U.S. Pat. No. 4,942,370, T. Shigemori).

However, in such bit synchronizers, a phase comparator or a frequency comparator has an output connected directly to an input of the low pass filter (integrator), in a similar manner to that in FIG. 1. For this reason, such bit synchronizers cannot overcome the above-mentioned problems.

Further, in the conventional bit synchronizers, making a DC gain of the low pass filter (integrator) of the PLL circuit larger causes the low pass filter (integrator) to output a maximum or minimum value in a transient lock-in state, resulting in an unstable free-run frequency of the VCO. This results in unstable operation of the PLL circuit. Making the DC gain of the low pass filter (integrator) of the PLL circuit smaller to prevent such instability causes the locking range of the PLL circuit to be reduced. As a result, the loop gain of the PLL circuit is varied according to the bit pattern of the input NRZ data.

SUMMARY OF THE INVENTION

Therefore, the present invention has been made in view of the above problems, and it is an object of the present invention to provide a high-speed bit synchronizer in which a phase comparator gain limiter is provided between a phase comparator and a low pass filter (integrator) to properly limit a gain of the phase comparator in such a manner that it limits the gain of tile phase comparator to the low pass filter (integrator) when the transition density of NRZ data is higher than a predetermined reference value, and passing the gain of the phase comparator directly to the low pass filter (integrator), not limited, when the transition density of NRZ data is lower than the predetermined reference value, so that the loop gain of a PLL circuit is not varied according to a bit pattern of the NRZ data.

It is another object of the present invention to provide a high-speed bit synchronizer in which an output pulse from a phase comparator is wave-shaped regardless of the bit rate of NRZ data and then applying the output pulse to a low pass filter (integrator), so that the low pass filter (integrator) can detect a low frequency component from the output pulse from the phase comparator with no distortion even when the data bit rate is high, thereby allowing a PLL circuit to be optimally operated.

It is a further object of the present invention to provide a high-speed bit synchronizer in which a VCO is operated to generate a clock pulse frequency synchronously with the frequency of an external reference clock pulse which is K times the VCO clock pulse frequency, where K is a natural number, so that a variation of the VCO oscillating frequency is reduced by 1/K for input and the VCO oscillating frequency is reduced in range, thereby making the stability of the VCO higher.

It is still another object of the present invention to provide a high-speed bit synchronizer in which a multi-stage control structure of the lock-in type is used to perform frequency synchronization within a desired frequency range and then perform a phase synchronization together with the frequency synchronization, for preventing interference between two outputs from affecting a lock-in state and for preventing a low pass filter (integrator) from outputting a maximum or minimum value, so that a VCO can generate a stabilized clock pulse frequency even though it has a wide frequency varying range, resulting in data and a clock being stably recovered.

In accordance with the present invention, the above and other objects can be accomplished by the provision of a high-speed bit synchronizer with a multi-stage control structure including a voltage controlled oscillator at an output stage. The high-speed bit synchronizer comprises: a phase comparator for detecting a phase relationship between a center of an eye pattern of input NRZ data and a rising transition of a clock pulse from the voltage controlled oscillator whenever the input NRZ data makes a transition, to detect whether the rising transition of the clock pulse from the voltage controlled oscillator is earlier than the center of the eye pattern of the input NRZ data, and outputting a first logic level and a first latch clock pulse in accordance with the detected result, the first latch clock pulse functioning to latch the first logic level, the phase comparator outputting no first latch clock pulse when the input NRZ data makes no transition, the phase comparator retiming the input NRZ data with a bit-synchronized clock pulse from the voltage controlled oscillator and outputting the retimed data externally; a phase comparator gain limiter for processing an output of the phase comparator at a period of an internal reference clock pulse if the period of the first latch clock pulse from the phase comparator is shorter than that of the internal reference clock pulse, the phase comparator gain limiter transferring the output of the phase comparator directly if the period of the first latch clock pulse from the phase comparator is longer than that of the internal reference clock pulse; the frequency comparator for detecting a frequency relationship between a multiple of a period of the clock pulse from the voltage controlled oscillator and a multiple of a period of an external reference clock pulse whenever the external reference clock pulse makes a rising or falling transition, the period of the external reference clock pulse being K times that of the frequency with which the clock pulse from the voltage controlled oscillator is to be synchronized, where K is a natural number, the frequency comparator outputting a second logic level and a second latch clock pulse if the frequency of the clock pulse from the voltage controlled oscillator is lower or higher than that to be synchronized, the second latch clock pulse functioning to latch the second logic level; a frequency comparator gain limiter for processing an output of the frequency comparator at the period of the internal reference clock pulse if a period of the second latch clock pulse from the frequency comparator is shorter than that of the internal reference clock pulse, the frequency comparator gain limiter transferring the output of the frequency comparator directly if the period of the second latch clock pulse from the frequency comparator is longer than that of the internal reference clock pulse; a frequency synchronous signal detector for generating a frequency synchronous signal if the period of the second latch clock pulse from the frequency comparator is longer than a predetermined reference value, to switch the present mode of a phase locked loop circuit to a phase/frequency synchronous mode, the frequency synchronous signal detector generating a frequency asynchronous signal if the period of the second latch clock pulse from the frequency comparator is shorter than the predetermined reference value, to switch the present mode of the phase locked loop circuit to a frequency synchronous mode; a phase difference output controller including an input connected to an output of the phase comparator gain limiter and an output of the frequency synchronous signal detector for controlling the transfer of the output of the phase comparator gain limiter in response to the output of the frequency synchronous signal detector; a low pass filter (integrator) for low pass filtering (integrating) only an output of the frequency comparator gain limiter before frequency synchronization is established, to detect therefrom a voltage of a low frequency component including a DC component, the low pass filter (integrator) low pass filtering (integrating) an output of the phase difference output controller and the output of the frequency comparator gain limiter after the frequency synchronization is established, to detect therefrom the voltage of the low frequency component including the DC component, the low pass filter (integrator) supplying the detected voltage to the voltage controlled oscillator; and a frequency-divider for frequency-dividing the clock pulse from the voltage controlled oscillator at a desired ratio and supplying the resultant clock pulse as the internal reference clock pulse to the phase comparator gain limiter and the frequency comparator gain limiter.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
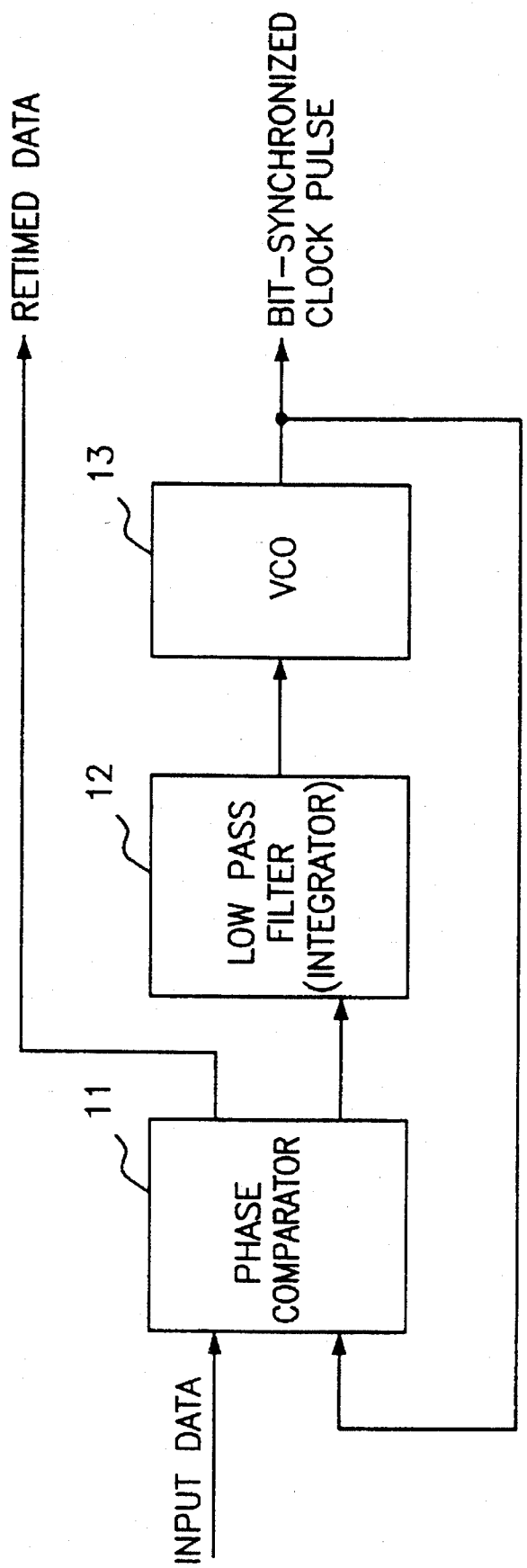
FIG. 1 is a block diagram of a conventional bit synchronizer.
Figure 2:
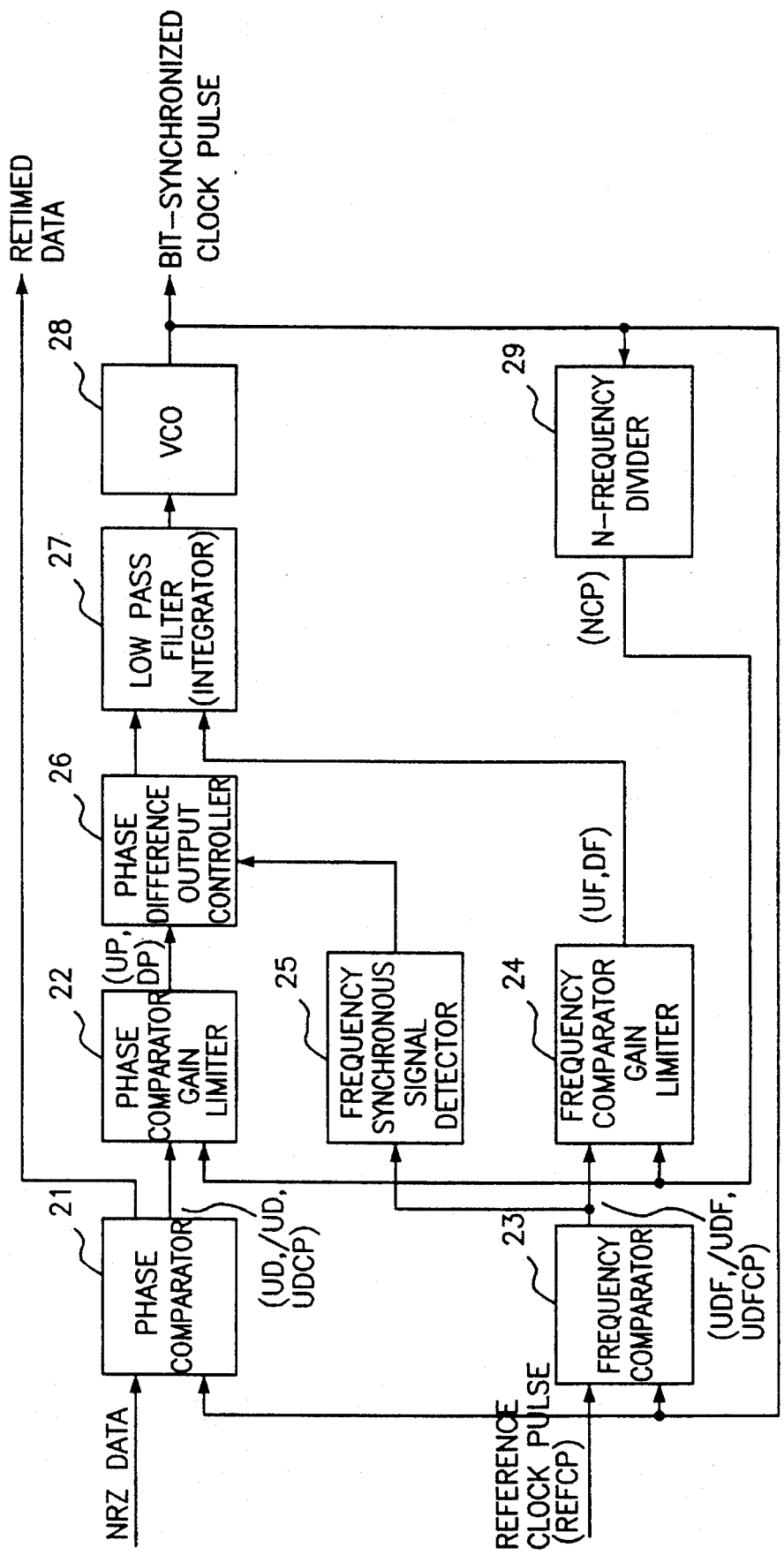
FIG. 2 is a block diagram of a high-speed bit synchronizer in accordance with an embodiment of the present invention.

Referring to FIG. 2, there is shown a block diagram of a high-speed bit synchronizer in accordance with an embodiment of the present invention. As shown in this drawing, the high-speed bit synchronizer comprises a phase comparator 21, a phase comparator gain limiter 22, a frequency comparator 23, a frequency comparator gain limiter 24, a frequency synchronous signal detector 25, a phase difference output controller 26, a low pass filter (integrator) 27, a VCO 28 and an N-frequency divider 29.

In FIG. 2, the phase comparator 21 is operated to detect a phase relationship between a center of an eye pattern of input NRZ data and a rising transition of a clock pulse RCP from the VCO 28, provided at an output stage of the bit synchronizer, whenever the input NRZ data makes a transition. Namely, the phase comparator 21 detects whether the rising transition of the clock pulse RCP from the VCO 28 is earlier than the center of the eye pattern of the input NRZ data. The phase comparator 21 then outputs a logic level UD or/UD and a latch clock pulse UDCP to the phase comparator gain limiter 22 in accordance with the detected result. The latch clock pulse UDCP functions to latch the logic level UD or /UD. The phase comparator 21 outputs no latch clock pulse when the input NRZ data makes no transition. Further, the phase comparator 21 retimes the input NRZ data with the bit-synchronized clock pulse RCP from the VCO 28 and outputs the retimed data RDATA externally.

The phase comparator gain limiter 22 is operated in response to the latch clock pulse UDCP from the phase comparator 21 and an internal reference clock pulse NCP from the N-frequency divider 29 which is obtained by frequency-dividing the clock pulse RCP from the VCO 28 by N. When a period of the latch clock pulse UDCP from the phase comparator 21 is shorter than that of the internal reference clock pulse NCP from the N-frequency divider 29, the phase comparator gain limiter 22 processes an output of the phase comparator 21 at the period of the internal reference clock pulse NCP from the N-frequency divider 29 in such a manner that a gain of the phase comparator 21 is not varied according to the number of transitions of the input NRZ data. If the period of the latch clock pulse UDCP from the phase comparator 21 is longer than that of the internal reference clock pulse NCP from the N-frequency divider 29, the phase comparator gain limiter 22 transfers the output of the phase comparator 21 directly so that the gain of the phase comparator 21 can be varied according to number of the transitions of the input NRZ data. As a result, the output of the phase comparator 21 is wave-shaped by the phase comparator gain limiter 22 into a pulse with a width being greater than a bit unit interval of the input NRZ data regardless of the bit rate of the input NRZ data. The wave-shaped pulse output from the phase comparator gain limiter 22 is then applied to the phase difference output controller 26.

The frequency comparator 23 is operated to detect a frequency relationship between a multiple of a period of the clock pulse RCP from the VCO 28 and a multiple of a period of an external reference clock pulse REFCP whenever the external reference clock pulse REFCP makes a rising or falling transition, the period of the external reference clock pulse REFCP being K times that of the frequency with which the clock pulse RCP from the VCO 28 is to be synchronized, where K is a natural number. When the frequency of the clock pulse RCP from the VCO 28 is lower or higher than that to be synchronized, the frequency comparator 23 outputs a logic level UDF or/UDF and a latch clock pulse UDFCP to the frequency comparator gain limiter 24. The latch clock pulse UDFCP functions to latch the logic level UDF or /UDF. The frequency comparator 23 outputs no latch clock pulse when the frequency of the clock pulse RCP from the VCO 28 is substantially the same as that to be synchronized.

The frequency comparator gain limiter 24 is operated in response to the latch clock pulse UDFCP from the frequency comparator 23 and the internal reference clock pulse NCP from the N-frequency divider 29 which is obtained by frequency-dividing the clock pulse RCP from the VCO 28 by N. When a period of the latch clock pulse UDFCP from the frequency comparator 23 is shorter than that of the internal reference clock pulse NCP from the N-frequency divider 29, the frequency comparator gain limiter 24 processes an output of the frequency comparator 23 at a period of the internal reference clock pulse NCP from the N-frequency divider 29 in such a manner that a gain of the frequency comparator 23 is not varied according to a frequency difference between the clock pulse RCP from the VCO 28 and the external reference clock pulse REFCP. If the period of the latch clock pulse UDFCP from the frequency comparator 23 is longer than that of the internal reference clock pulse NCP from the N-frequency divider 29, the frequency comparator gain limiter 24 transfers the output of the frequency comparator 23 directly. As a result, the output of the frequency comparator 23 is wave-shaped by the frequency comparator gain limiter 24 into a pulse being of a width regardless of the period of the external reference clock pulse REFCP. The wave-shaped pulse output from the frequency comparator gain limiter 24 is then applied to the low pass filter (integrator) 27.

The frequency synchronous signal detector 25 has an input connected to the output of the frequency comparator 23 for detecting a frequency synchronous state in response to the logic level UF or/UF and the latch clock pulse UDFCP from the frequency comparator 23. If the frequency of the clock pulse RCP from the VCO 28 is substantially the same as that to be synchronized, the frequency synchronous signal detector 25 generates the frequency synchronous signal for switching a present mode of a PLL circuit to a phase/frequency synchronous mode to reduce a locking range of the PLL circuit. The frequency synchronous signal detector 25 then outputs the generated frequency synchronous signal to the phase difference output controller 26. If the frequency of the clock pulse RCP from the VCO 28 is lower or higher than that to be synchronized, the frequency synchronous signal detector 25 generates a frequency asynchronous signal for switching the present mode of the PLL circuit to a frequency synchronous mode to increase the locking range of the PLL circuit. The frequency synchronous signal detector 25 then outputs the generated frequency asynchronous signal to the phase difference output controller 26.

The phase difference output controller 26 has an input connected to an output of the phase comparator gain limiter 22 and an output of the frequency synchronous signal detector 25 for controlling the transfer of the output of the phase comparator gain limiter 22 in response to the output of the frequency synchronous signal detector 25. Upon receiving the frequency synchronous signal from the frequency synchronous signal detector 25, the phase difference output controller 26 transfers the output UP or DP of the phase comparator gain limiter 22 to the low pass filter (integrator) 27. Upon receiving the frequency asynchronous signal from the frequency synchronous signal detector 25, the phase difference output controller 26 does not transfer the output UP or DP of the phase comparator gain limiter 22 to the low pass filter (integrator) 27.

The low pass filter (integrator) 27 has an input connected to an output of the frequency comparator gain limiter 24 and an output of the phase difference output controller 26. When the phase difference output controller 26 does not transfer the output UP or DP of the phase comparator gain limiter 22, namely, frequency synchronization is not still established, the low pass filter (integrator) 27 low pass filters (integrates) only the output UF or DF of the frequency comparator gain limiter 24 to detect therefrom a voltage VF of a low frequency component including a DC component. The detected voltage VF from the low pass filter (integrator) 27 is supplied to the VCO 28.

When the phase difference output controller 26 transfers the output UP or DP of the phase comparator gain limiter 22, namely, the frequency synchronization has been established, the low pass filter (integrator) 27 low pass filters (integrates) the output UP or DP of the phase comparator gain limiter 22 and the output. UF or DF of the frequency comparator gain limiter 24 to detect therefrom the voltage VF of the low frequency component including the DC component. The detected voltage VF from the low pass filter (integrator) 27 is supplied to the VCO 28.

Further, the low pass filter (integrator) 27 outputs the voltage VF to the VCO 28 in a symmetrical swing manner under a normal condition. Provided that no transition is present in the external reference clock pulse REFCP as well as in the input NRZ data, the low pass filter (integrator) 27 stabilizes its output voltage VF at a symmetrical center value and supplies the resultant voltage to the VCO 28, resulting in the VCO 28 being stably free-run.

The VCO 28 varies a phase and the frequency of its output clock pulse RCP in response to the output voltage VF from the low pass filter (integrator) 27 and supplies the resultant clock pulse to the output stage of the bit synchronizer, the phase comparator 21, the frequency comparator 23 and the N-frequency divider 29.

The N-frequency divider 29 frequency-divides the clock pulse RCP from the VCO 28 by N and supplies the resultant clock pulse as the internal reference clock pulse NCP to the phase comparator gain limiter 22 and the frequency comparator gain limiter 24.

Figure 3:
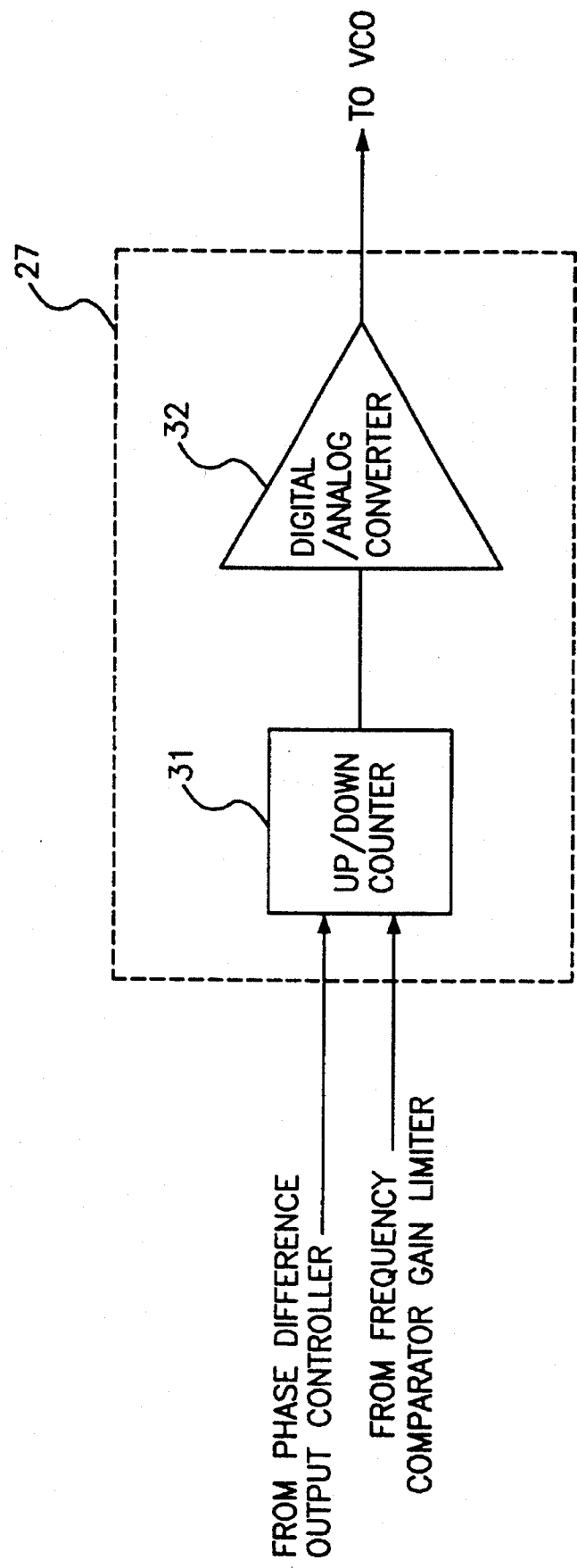
FIG. 3 is a block diagram of a high-speed bit synchronizer in accordance with an alternative embodiment of the present invention.

Referring to FIG. 3, there is shown a block diagram of a high-speed bit synchronizer in accordance with an alternative embodiment of the present invention. In this drawing, the reference numeral 31 designates an up/down counter and the reference numeral 32 designates a digital/analog converter, and all the components other than the low pass filter (integrator) 27 are substantially the same in construction as those in FIG. 2 and will thus not be shown.

In the alternative embodiment of the present invention, the components in FIG. 2 are all comprised of digital circuits to arrange one bit synchronizer in a digital form, and the low pass filter (integrator) 27 of them includes the up/down counter 31 and the digital/analog converter 32 in FIG. 3. The up/down counter 31 has an input connected to the output off the phase difference output controller 26 and the output of the frequency comparator gain limiter 24. The digital/analog converter 32 has an input connected to an output of the up/down counter 31.

In FIG. 3, the remaining components, not shown and being designated by like reference numerals, are substantially the same in function as those of FIG. 2 and details thereof will thus be omitted.

Now, the operation of the low pass filter (integrator) 27 in accordance with the alternative embodiment of the present invention will hereinafter be described in detail with reference to FIG. 3.

The up/down counter 31 has the input connected to the output of the phase difference output controller 26 and the output of the frequency comparator gain limiter 24. The up/down counter 31 up or down-counts only the output UF or DF of the frequency comparator gain limiter 24 before the frequency synchronization is established, to generate a digital value of a low frequency component. The generated digital value from the up/down counter 31 is supplied to the digital/analog converter 32. After the frequency synchronization is established, the up/down counter 31 up down-counts the output UP or DP of the phase difference output controller 26 and the output UF or DF off the frequency comparator gain limiter 24 to generate the digital value of the low frequency component. The generated digital value from the up/down counter 31 is supplied to the digital/analog converter 32. Further, if no transition is present in the external reference clock pulse REFCP as well as in the input NRZ data, the up/down counter 31 outputs the digital value at a previous data transition to the digital/analog converter 32, resulting in the VCO 28 being stably free-run.

The digital/analog converter 32 has the input connected to the output of the up/down counter 31. The digital/analog converter 32 converts the digital value from the up/down counter 31 into an analog value and supplies the converted analog value as the voltage VF of the low frequency component to the VCO 28.

As apparent from the above description, according to the present invention, the PLL circuit has a loop gain regardless of the bit pattern and the bit rate of the input NRZ data. Also, the data and the clock can be stably recovered even though the VCO has a wide frequency varying range. Therefore, the high-speed bit synchronizer of the present invention has the following unique effects over the conventional bit synchronizers.

First, the loop gain of the PLL circuit is properly controlled according to the bit pattern of the input NRZ data in such a manner that it is not varied according to the bit pattern of the input NRZ data. Therefore, the bit synchronizer has excellent performance when in is applied to NRZ bit synchronization using no line code.

Second, the output pulse from the phase comparator is wave-shaped regardless of the bit rate of the input NRZ data so that the low frequency component can be detected therefrom with no distortion even when the data bit rate is high. Therefore, the PLL circuit can be operated at an optimum state, resulting in the high-speed bit synchronizer having a stable operation.

Third, the multi-stage control structure of the lock-in type is used to perform the frequency synchronization within the desired frequency range and then perform the phase synchronization together with the frequency synchronization. Therefore, the lock-in state is not affected by the interference between the two outputs and the low pass filter (integrator) cannot output the maximum or minimum value. Also, the VCO generates the clock pulse frequency synchronously with the frequency of the external reference clock pulse, which is K times the VCO clock pulse frequency, where K is a natural number, so that the VCO oscillating frequency cannot be significantly varied even though the input NRZ data makes little transition. Therefore, although the VCO has a wide frequency varying range, the bit synchronization can be stably performed and the free-run frequency of the VCO is stably controllable by the external reference clock pulse.

Fourth, maintaining the period of the N-frequency-divided clock pulse constant allows the low pass filter (integrator) to have a constant time constant regardless of the bit rate and the bit pattern of the input NRZ data. The use of the low pass filter (integrator) with the constant time constant results in the bit synchronization being stabilized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A high-speed bit synchronizer with a multi-stage control structure including a voltage controlled oscillator at an output stage, comprising:

phase comparator means for detecting a phase relationship between a center of an eye pattern of input NRZ data and a rising transition of a clock pulse from said voltage controlled oscillator whenever the input NRZ data makes a transition, to detect whether the rising transition of the clock pulse from said voltage controlled oscillator is earlier than the center of the eye pattern of the input NRZ data, and outputting a first logic level and a first latch clock pulse in accordance with the detected result, the first latch clock pulse functioning to latch the first logic level, said phase comparator means outputting no first latch clock pulse when the input NRZ data makes no transition, said phase comparator means retiming the input NRZ data with a bit-synchronized clock pulse from said voltage controlled oscillator and outputting the retimed data externally;

phase comparator gain limiting means for processing an output of said phase comparator means at a period of an internal reference clock pulse if a period of the first latch clock pulse from said phase comparator means is shorter than that of the internal reference clock pulse, said phase comparator gain limiting means transferring the output of said phase comparator means directly if the period of the first latch clock pulse from said phase comparator means is longer than that of the internal reference clock pulse;

frequency comparator means for detecting a frequency relationship between a multiple of a period of the clock pulse from said voltage controlled oscillator and a multiple of a period of an external reference clock pulse whenever the external reference clock pulse makes a rising or falling transition, the period of the external reference clock pulse being K times that of a frequency with which the clock pulse from said voltage controlled oscillator is to be synchronized, where K is a natural number, said frequency comparator means outputting a second logic level and a second latch clock pulse if a frequency of the clock pulse from said voltage controlled oscillator is lower or higher than that to be synchronized, the second latch clock pulse functioning to latch the second logic level;

frequency comparator gain limiting means for processing an output of said frequency comparator means at the period of the internal reference clock pulse if a period of the second latch clock pulse from said frequency comparator means is shorter than that of the internal reference clock pulse, said frequency comparator gain limiting means transferring the output of said frequency comparator means directly if the period of the second latch clock pulse from said frequency comparator means is longer than that of the internal reference clock pulse;

frequency synchronous signal detection means for generating a frequency synchronous signal if the period of the second latch clock pulse from said frequency comparator means is longer than a predetermined reference value, to switch a present mode of a phase locked loop circuit to a phase/frequency synchronous mode, said frequency synchronous signal detection means generating a frequency asynchronous signal if the period of the second latch clock pulse from said frequency comparator means is shorter than the predetermined reference value, to switch the present mode of said phase locked loop circuit to a frequency synchronous mode;

phase difference output control means including an input connected to an output of said phase comparator gain limiting means and an output of said frequency synchronous signal detection means for controlling the transfer of the output of said phase comparator gain limiting means in response to the output of said frequency synchronous signal detection means;

low pass filtering (integrating) means for low pass filtering (integrating) only an output of said frequency comparator gain limiting means before frequency synchronization is established, to detect therefrom a voltage of a low frequency component including a DC component, said low pass filtering (integrating) means low pass filtering (integrating) an output of said phase difference output control means and the output of said frequency comparator gain limiting means after the frequency synchronization is established, to detect therefrom the voltage of the low frequency component including the DC component, said low pass filtering (integrating) means supplying the detected voltage to said voltage controlled oscillator; and frequency-dividing means for frequency-dividing the clock pulse from said voltage controlled oscillator at a desired ratio and supplying the resultant clock pulse as the internal reference clock pulse to said phase comparator gain limiting means and said frequency comparator gain limiting means.

2. A high-speed bit synchronizer with a multi-stage control structure as set forth in claim 1, wherein said low pass filtering (integrating) means includes:

an up/down counter having an input connected to the output of said phase difference output control means and the output of said frequency comparator gain limiting means, said up/down counter up or down-counting only the output of said frequency comparator gain limiting means before the frequency synchronization is established, to generate a digital value of a low frequency component, said up/down counter up or down-counting the output of said phase difference output control means and the output of said frequency comparator gain limiting means after the frequency synchronization is established, to generate the digital value of the low frequency component; and a digital/analog converter for converting the digital value from said up/down counter into an analog value and supplying the converted analog value as the voltage of the low frequency component to said voltage controlled oscillator.

3. A high-speed bit synchronizer with a multi-stage control structure as set forth in claim 1, wherein said low pass filtering (integrating) means is operated to output the voltage to said voltage controlled oscillator in a symmetrical swing manner under a normal condition, said low pass filtering (integrating) means stabilizing its output voltage at a symmetrical center value and supplying the resultant voltage to said voltage controlled oscillator, if no transition is present in the external reference clock pulse as well as in the input NRZ data.

4. A high-speed bit synchronizer with a multi-stage control structure as set forth in claim 2, wherein said up/down counter is operated to output the digital value at a previous data transition to said digital/analog converter if no transition is present in the external reference clock pulse as well as in the input NRZ data.

5. A high-speed bit synchronizer with a multi-stage control structure as set forth in claim 1, wherein said phase comparator gain limiting means is operated to wave-shape the output of said phase comparator means into a pulse with a width being greater than a bit unit interval of the input NRZ data.

6. A high-speed bit synchronizer with a multi-stage control structure as set forth in claim 1, wherein said frequency comparator gain limiting means is operated to wave-shape the output of said frequency comparator means into a pulse with a width being greater than the period of the clock pulse from said voltage controlled oscillator.

* * * * *